United States Patent [19]
Donahue et al.

[11] Patent Number: 6,016,947
[45] Date of Patent: Jan. 25, 2000

[54] NON-DESTRUCTIVE LOW MELT TEST FOR OFF-COMPOSITION SOLDER

[75] Inventors: Timothy W. Donahue, Port Ewen, N.Y.; Ellyn M. Ingalls, Danbury, Conn.; Chon Cheong Lei; Wai Mon Ma, both of Poughkeepsie, N.Y.; Horatio Quinones, Wappingers Falls, N.Y.; Charles L. Reynolds, Jr., Red Hook, N.Y.; Peter J. Brofman, Hopewell Junction, N.Y.

[73] Assignee: International Business Machines Corporation, Armonk, N.Y.

[21] Appl. No.: 08/954,988

[22] Filed: Oct. 21, 1997

[51] Int. Cl.⁷ ................................................. H01L 21/00
[52] U.S. Cl. ................ 228/103; 228/180.1; 228/180.21; 228/104; 228/105; 420/563; 420/565; 420/570
[58] Field of Search ................................ 228/103, 180.1, 228/180.21, 104, 105; 420/563, 565, 570

[56] References Cited

U.S. PATENT DOCUMENTS

| | | |
|---|---|---|
| 4,076,164 | 2/1978 | Freshcorn . |
| 4,914,814 | 4/1990 | Behun et al. . |
| 5,324,892 | 6/1994 | Granier et al. ........................... 174/250 |
| 5,516,028 | 5/1996 | Rasp et al. ............................... 228/104 |
| 5,620,132 | 4/1997 | Downing et al. ....................... 228/264 |
| 5,641,990 | 6/1997 | Chiu ......................................... 257/737 |
| 5,718,361 | 2/1998 | Braun et al. ........................... 228/56.3 |
| 5,718,367 | 2/1998 | Covell, II et al. ...................... 228/254 |

OTHER PUBLICATIONS

Metal Handbook 9th ed. vol. 6; ASM Handbooks; American Society for metals 1983. p. 1070–72.

S.O. Bowen et al., Guardbanding Card Assemblies Within The Manufacturing Line, IBM Technical Disclosure Bulletin, vol. 34 No. 7B, 343–4 (1991).

*Primary Examiner*—Patrick Ryan
*Assistant Examiner*—M. Alexandra Elve
*Attorney, Agent, or Firm*—Ratner & Prestia; Tiffany L. Townsend

[57] ABSTRACT

A non-destructive method for identifying off-composition solder columns of for example, a ceramic column grid array. The method is performed at the ceramic module level prior to card assembly to avoid costly loss or rework post card assembly. The assembly of solder columns on a substrate is heated to a temperature below the melting temperature of pure-composition solder and above the temperature of attachment of a solder column to an organic board. Heating the assembly produces visually detectable changes characteristic of off-composition solder which are used for identifying which solder columns are composed of off-composition solder.

20 Claims, 7 Drawing Sheets

FIG. 1

PRIOR ART

FIG. 2

PRIOR ART

FIG. 8

NON-DESTRUCTIVE LOW MELT TEST FOR OFF-COMPOSITION SOLDER

TECHNICAL FIELD

The present invention relates, in general, to a method of testing for off-composition solder and, in particular, to testing for off-composition solder columns of a ceramic column grid array before attachment to a circuit card.

BACKGROUND OF THE INVENTION

Electronic packaging generally contains many levels of packages and interconnections. A first level package may connect one or more silicon chips on a ceramic substrate carrier. A second level package may interconnect one or more such ceramic substrate carriers on an organic board.

The ceramic substrate is connected to the organic board by pins which are typically rigid. The rigid pins are brazed on the ceramic substrate with a suitable braze material such as a gold-tin alloy. Ceramic substrates with such pin grid arrays (PGA) are subsequently plugged into a connector or wave soldered to an array of plated through holes on the organic board. This connection system has disadvantages such as the through holes limiting the number of wiring channels available in the board. Another disadvantage is the high cost associated with the braze material, the rigid metal pins, and the pin connectors or plated through holes.

As disclosed in U.S. Pat. No. 4,914,814, these disadvantages can be avoided by using solder column connection (SCC) technology which is also known as CCGA (ceramic column grid array) technology. SCC technology has a lower cost than PGA technology. SCC technology also provides an improved electrical interconnection that can better withstand the stresses associated with thermal expansion mismatch between a ceramic carrier and a supporting circuit board.

Figure 1:
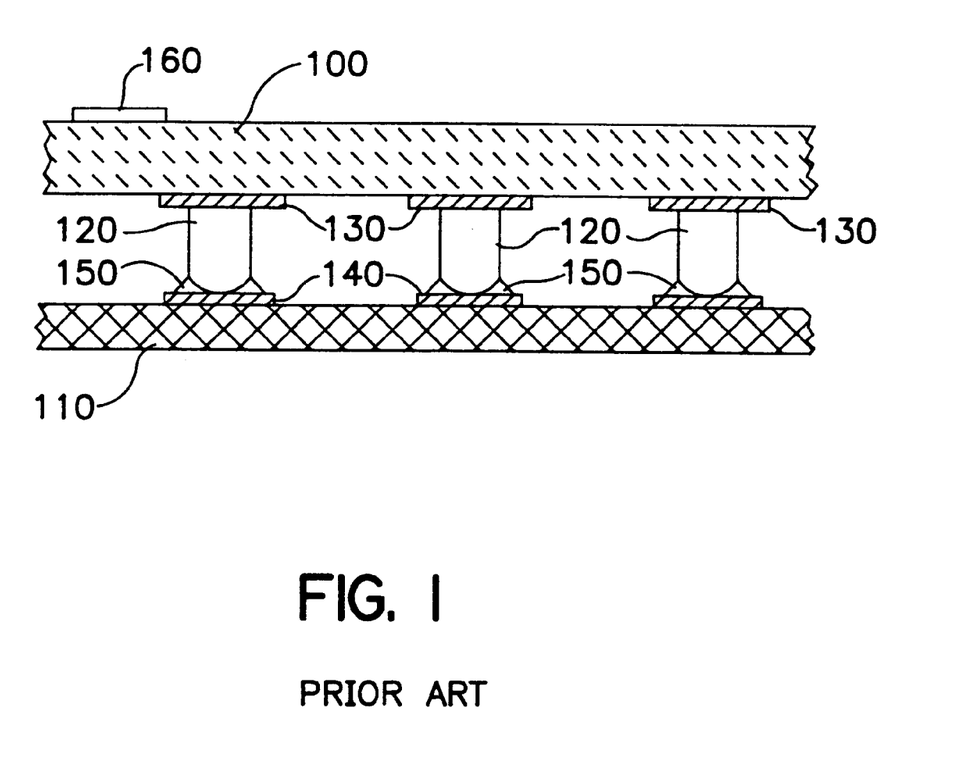
FIG. 1 is a partial cross-sectional view of a ceramic substrate carrier attached to a circuit board by using solder column connection technology.

Referring to FIG. 1, a ceramic carrier 100 may have one or more semiconductor chips 160 attached thereon. To connect a ceramic carrier 100 to a supporting circuit board 110 using SCC technology, solder columns 120, typically 90% lead/10% tin, are used. The solder columns 120 are first formed and then attached to the ceramic carrier 100, then the end of the solder columns 120 opposite the ceramic carrier 100 is attached to the circuit board 110.

Figure 2:
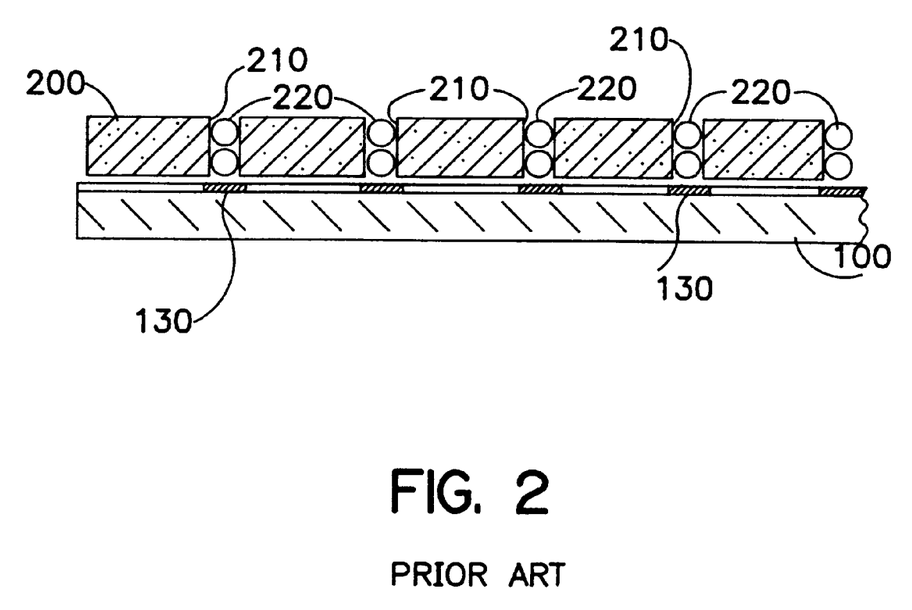
FIG. 2 a partial cross sectional view of a ceramic substrate carrier in alignment with a mold containing solder segments.

Referring to FIG. 2, the solder columns 120 of FIG. 1 are formed and then attached to the substrate 100 by using a graphite mold 200. The mold 200 has an array of pin holes 210. The pin holes 210 of the mold 200 are filled with solder segments 220. The ceramic carrier 100 is aligned (X, Y and radial adjustment) so its conductive I/O pads 130 are in alignment with the ends of solder segments 220 in the pin holes 210 of the graphite mold 200. Flux is applied on the substrate 100 surface and the substrate and solder segments 220 are assembled together. The assembly is processed through a furnace which joins the solder segments 220 to the conductive I/O pads 130 of the ceramic carrier 100, resulting in the formation of cast solder columns 120 of FIG. 1.

Referring to FIG. 1, to attach the ceramic substrate 100 with the cast solder columns 120 to an organic board 110, eutectic solder paste 150 is applied to metallized pads 140 of the organic board 110. The ends of the solder columns 120 opposite the substrate 100 are aligned with the metallized pads 140 and they are passed through a furnace which melts the eutectic solder paste 150 and bonds the metallized pads 140 and the solder columns 120.

A problem associated with the CCGA process is caused by poor solder quality. The composition of incoming solder used in the mold 200 to create solder columns 120 can vary from the pure-composition of 90% lead/10% tin. Solder varying in composition from pure-composition solder is referred to as off-composition solder. Off-composition solder having a lower lead content than pure-composition solder has a lower melting point than pure-composition solder. The melting point of pure-composition solder is approximately 300° C. The melting point of off-composition solder columns typically ranges from 183° C. to 220° C. The exact melting point of off-composition cast columns depends on their lead/tin alloy composition.

The use of off-composition solder columns to attach a substrate 100 to a board 110 can result in manufacturing defects. When a substrate 100 with off-composition columns is attached to an organic board, during the reflowing of the eutectic solder paste 150 on the board 110, the off-composition columns are partially melted. This can result in several defects post module/card assembly. These defects include the columns being hourglass shaped and/or having a small solder fillet at the card side of the column. These defects result in possible loss or expensive rework at the card level assembly.

SUMMARY OF THE INVENTION

The present invention provides a method of testing for and detecting off-composition solder columns before attachment of the solder columns to a circuit board. The method includes the steps of assembling a plurality of solder columns. Before the attachment of the solder columns to a circuit board, the assembly of solder columns is heated according to a temperature profile. The temperature profile is one which will produce visually detectable changes in off-composition solder columns. After heating, the solder columns are visually inspected for changes representative of off-composition solder columns, and the solder columns showing the changes are identified as being off-composition.

BRIEF DESCRIPTION OF THE DRAWING

The invention is best understood from the following detailed description when read in connection with the accompanying drawings. It is emphasized that, according to common practice, the various features of the drawing are not to scale. On the contrary, the dimensions of the various features are arbitrarily expanded or reduced for clarity. Included in the drawings are the following figures.

DETAILED DESCRIPTION OF THE INVENTION

Figure 3:
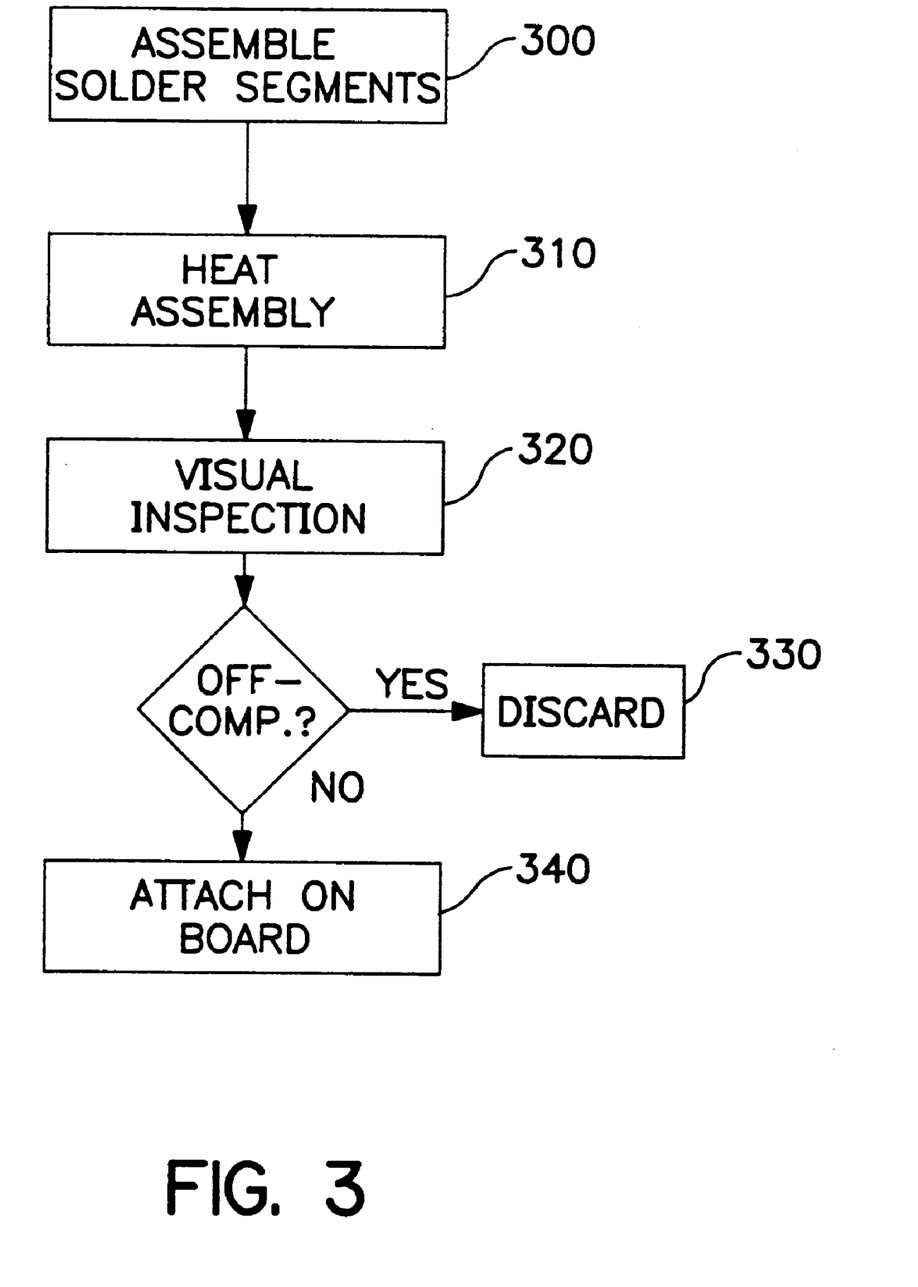
FIG. 3 is a flow chart depicting an embodiment of a method of the present invention.

Referring now to the drawings, wherein like reference numerals refer to like elements throughout, FIG. 3 shows a flow chart of a method of testing for and detecting off-composition solder columns for example of a ceramic column grid array (CCGA), according to an embodiment of the present invention.

In step 300 of FIG. 3, a plurality of solder columns are assembled. Before the assembly of solder columns are attached to a circuit board, the assembly of solder columns is heated in step 310 according to a temperature profile. The heating step 310 will produce visually detectable changes in off-composition solder columns. This is due to off-composition solder columns having a higher tin content than pure-composition solder columns which results in the off-composition solder columns having a lower melting point than pure-composition solder columns.

After heating according to the temperature profile is complete, the solder columns are visually inspected in step 320 for changes representative of off-composition solder columns. These changes to the solder columns will identify which solder columns are off-composition solder columns. An assembly is then discarded in step 330 if changes representative of off-composition solder columns are discovered during the visual inspection step 320, or the is assembly can be attached in step 340 on an organic board if changes representative of off-composition solder columns are not seen during the visual inspection step 320.

Figure 4:
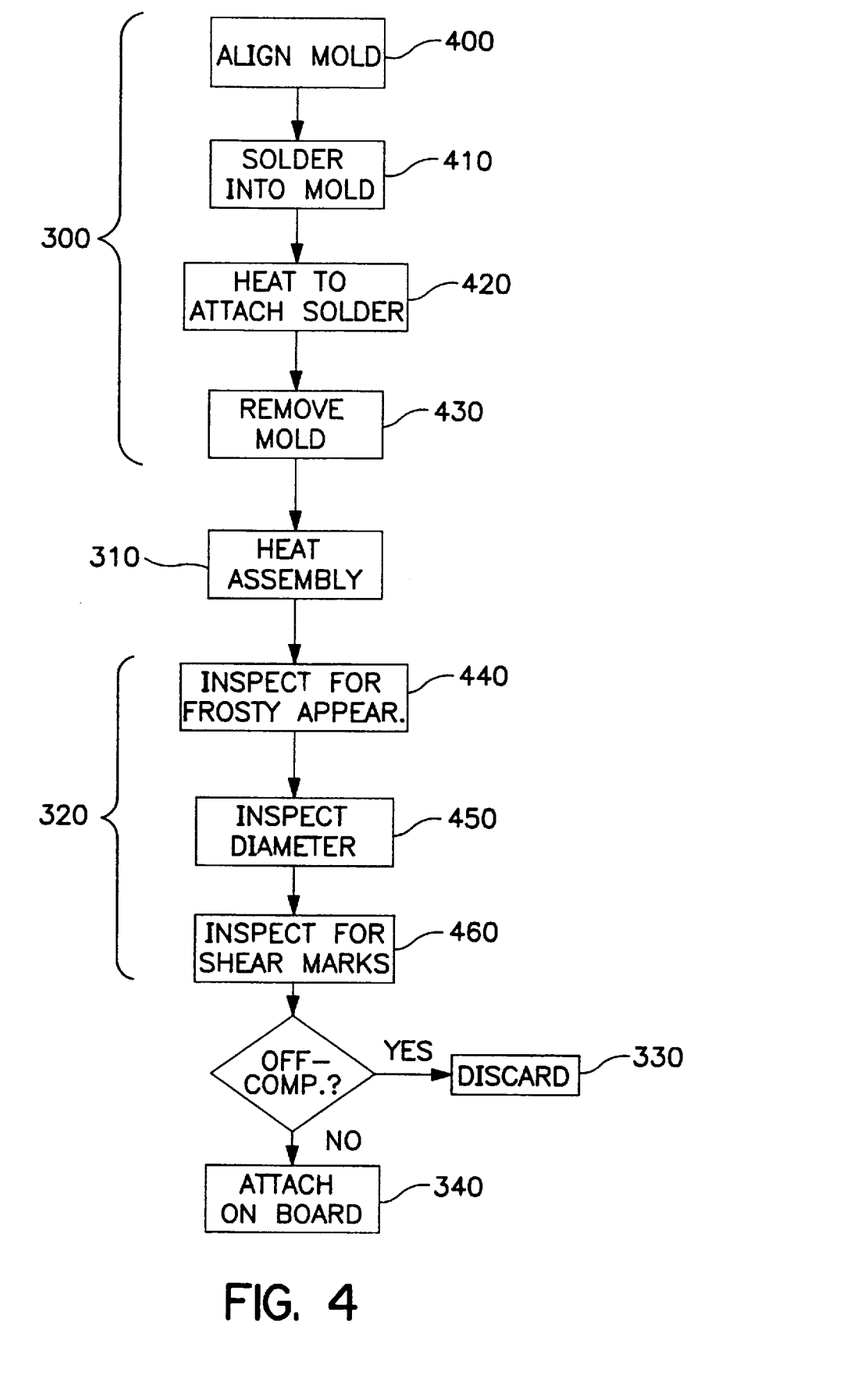
FIG. 4 is a flow chart depicting a particular preferred embodiment of a method of the present invention.

While referring to FIGS. 1 and 2, FIG. 4 shows a flow chart according to a particular preferred embodiment of the present invention. In this preferred embodiment, the solder columns 120 are attached to a substrate 100 to form the assembly. To create this assembly, a mold 200 that is typically made of graphite, is aligned in step 400 with metallized pads 130 of a substrate. The mold 200 is filled in step 410 with solder segments 220. The substrate and mold are then heated in step 420 which forms the solder segments 220 into solder columns 120 which are attached to the metallized pads 130 of the substrate.

The assembly of solder columns 120 and substrate 100 are then heated in step 310 according to a temperature profile. The temperature profile has a maximum temperature less than the melting temperature of a pure-composition solder column and greater than the temperature of attachment of a solder column to an organic board. For a pure-composition solder column comprising 90% lead and 10% tin, the temperature profile preferably does not exceed the temperature of 224° C.

Preferably, the temperature of the assembly is maintained above one or more specified temperatures for specified durations. For example, with reference to the temperature profile of FIG. 6, the heating step 310 may include the following steps: (1) increasing the furnace temperature to a first temperature TEMP1 above which the furnace is maintained for a first duration TIME1; (2) further increasing the furnace temperature to a peak temperature TEMP2 which is less than the melting point of a pure-composition solder column; and (3) decreasing the temperature of the furnace to an exit temperature EXIT_TEMP which is less than the first temperature TEMP1.

Figure 6:
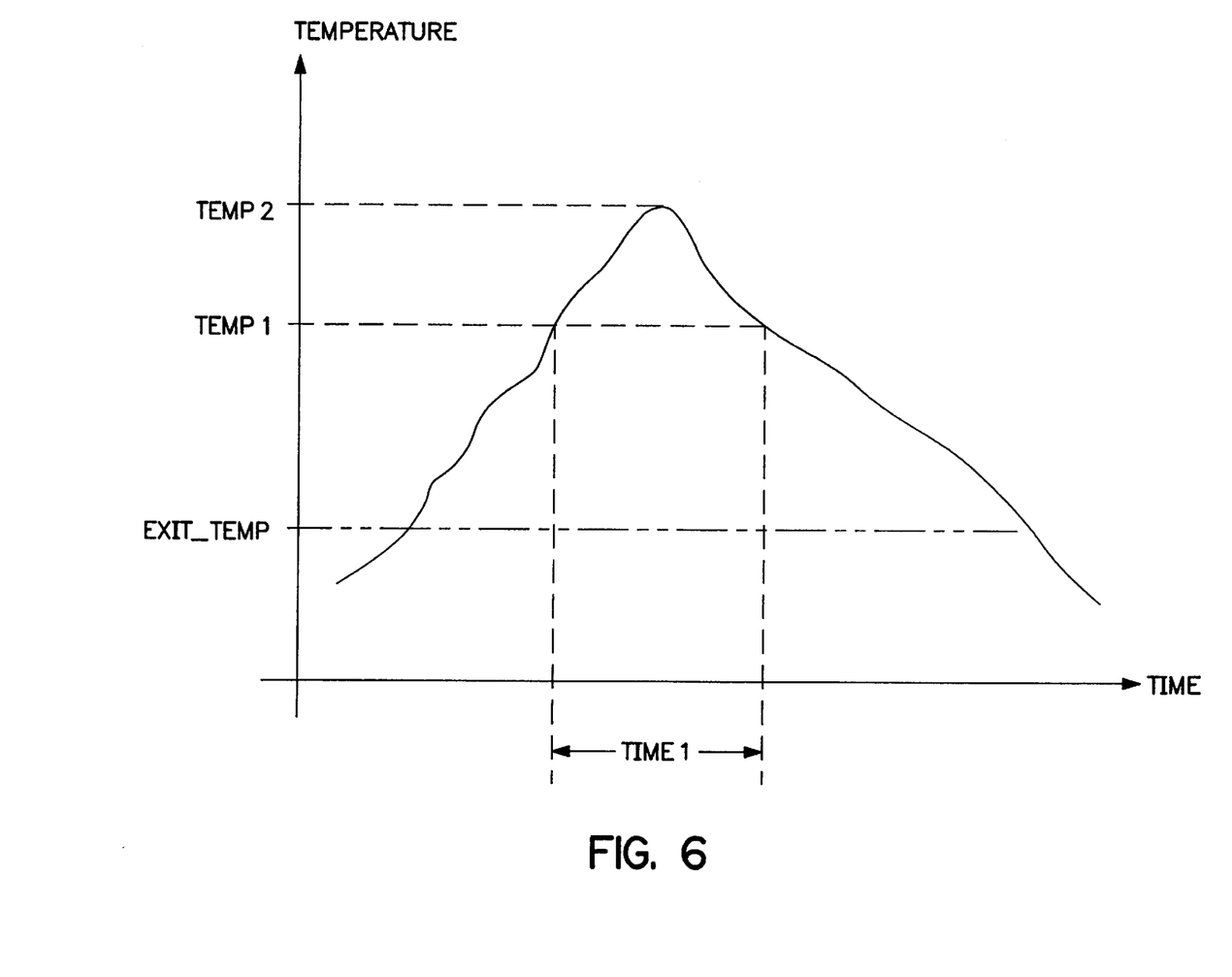
FIG. 6 is a curve of a temperature profile according to the present invention.

In a preferred embodiment, where pure-composition solder is comprised of 90% lead/10% tin, TEMP1 is 183° C., TEMP2 (peak temperature) is 224° C., TIME1 is 3.5 minutes, and EXIT_TEMP is 75° C.

Figure 5:
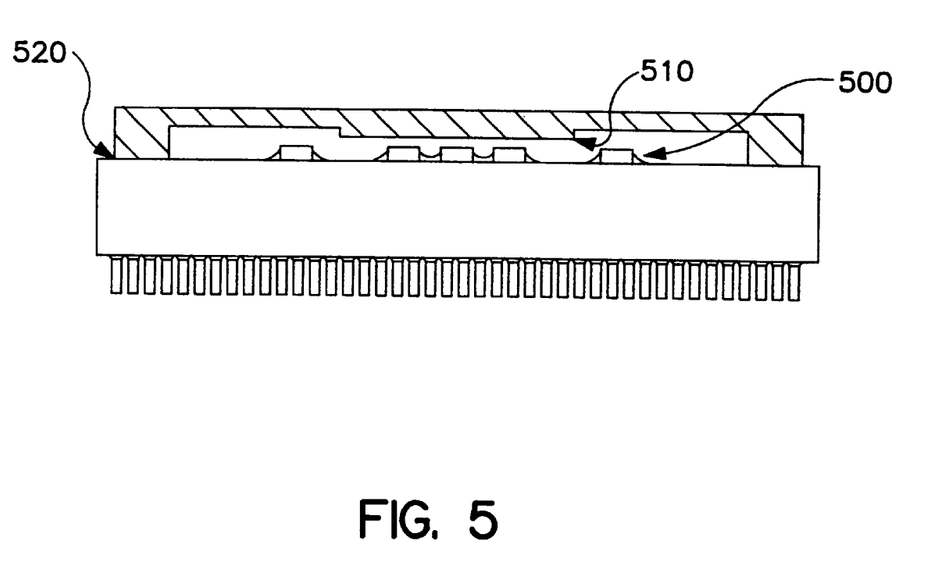
FIG. 5 is a cross sectional view of a ceramic substrate carrier showing examples of module package materials with which a temperature profile should be compatible.

FIG. 5 shows examples of module package materials with which the temperature profile must be compatible. These materials may include epoxy encapsulant 500, advanced thermal compound 510, and silicone lid attachment material 520.

Figure 7:
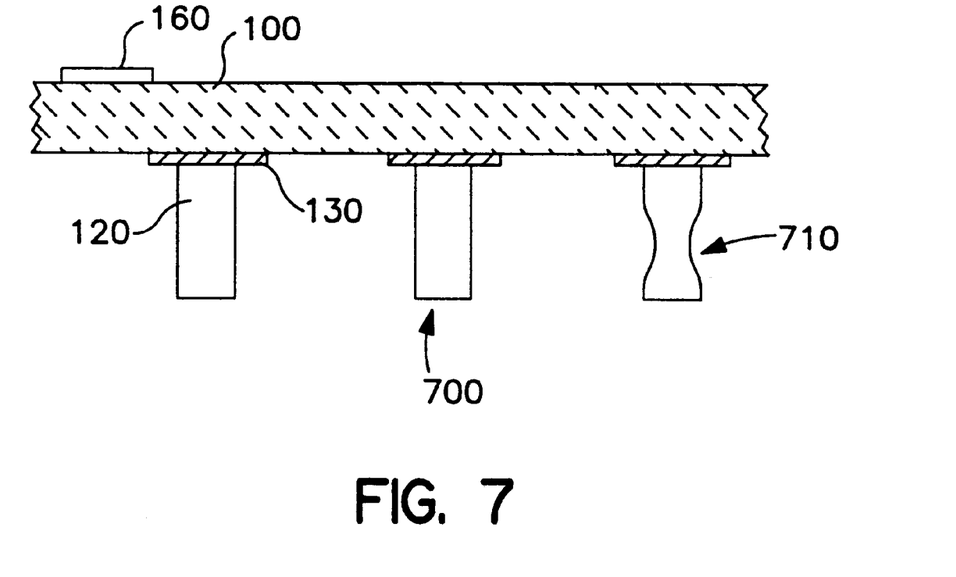
FIG. 7 shows an off-composition solder column having a smaller diameter than other solder columns.
Figure 8:
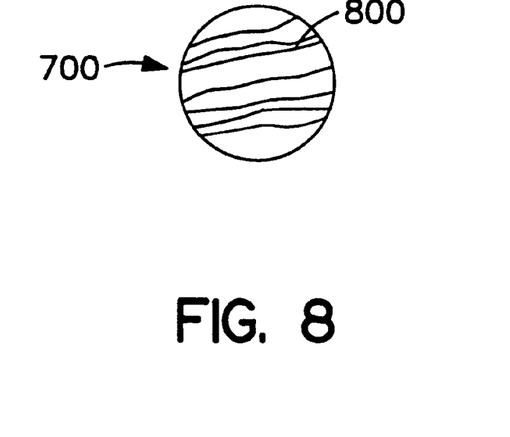
FIG. 8 shows shear marks on the end of a solder column opposite a ceramic substrate carrier.

After heating step 310, the solder columns are visually inspected in step 320 for changes representative of off-composition solder columns. Referring to FIGS. 4, 7, and 8, the visual inspection preferably includes inspection step 440 for solder columns having a frosty appearance, inspection step 450 for solder columns having a smaller diameter 710 than that of other solder columns of the assembly, and inspection step 460 for solder columns lacking visible shear marks 800.

Solder columns are inspected in step 460 for a lack of visible shear marks 800 when shear marks 800 were present before heating. This is the case, for example, when shear marks are formed during the process of assembling the solder columns and a substrate. After attaching solder columns 120 to a substrate 100 as described above in steps 400, 410, and 420, the solder columns may not all be the same length. The solder columns may be sheared to make them all the same length, the shearing process resulting in shear marks 800 on the ends 700 of the solder columns opposite the substrate.

If the visual inspection steps 440, 450, 460 identifies any solder columns that are off-composition, an assembly containing those solder columns is discarded in step 330. If off-composition solder columns are not identified on a substrate 100, that assembly of substrate and solder columns may be attached in step 340 to an organic board.

The present invention provides a method of testing solder columns of a ceramic column grid array before the attachment of the solder columns to an organic board. This results in manufacturing cost savings by avoiding possible loss or expensive rework resulting from defect discovery due to off-composition solder after the solder columns have been attached to an organic board. Examples of this invention have been provided using 90% lead/10% tin solder. Those skilled in the art can apply the teachings of this invention to applications using other compositions of solder. One skilled in the art may also vary the temperature profile. For example, the temperature profile can be varied if lower tolerances in solder composition variances are required according to the package materials of a particular module.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A method of testing for and detecting off-composition solder columns comprising the steps of:

attaching a plurality of solder columns to a substrate to form an assembly;

before attachment of the assembly of the substrate and the solder columns to a circuit board, heating the assembly of the substrate and the solder columns according to a temperature profile which will produce visually detectable changes in off-composition solder columns; and visually inspecting the solder columns for changes representative of off-composition solder columns to identify off-composition solder columns.

2. A method according to claim 1, further including the step of discarding off-composition solder columns.

3. A method according to claim 1, wherein the changes in off-composition solder columns include at least one of:

(a) solder columns having a frosty appearance, and (b) solder columns having a diameter smaller than the diameter of other solder columns of the assembly.

4. A method according to claim 3, wherein
   (a) the plurality of solder columns are sheared; and
   (b) the changes in off-composition solder columns further includes solder columns lacking visible shear marks.

5. A method according to claim 1, wherein the temperature profile has a maximum temperature less than the melting temperature of a pure-composition solder column and greater than the temperature of attachment of a solder column to a circuit board.

6. A method according to claim 1, wherein the assembled solder columns are attached to a substrate before the assembly is heated.

7. A method according to claim 1, wherein the step of heating the assembly comprises the steps of:
   (a) inserting the solder columns into a furnace,
   (b) increasing the furnace temperature to a first temperature above which the furnace is maintained for a first duration,
   (c) further increasing the furnace temperature to a peak temperature less than the melting point of a pure-composition solder column,
   (d) decreasing the temperature of the furnace to an exit temperature which is less than the first temperature, and
   (e) removing the solder columns from the furnace.

8. A method according to claim 1, wherein a pure-composition solder column comprises 90% lead and 10% tin and the temperature profile does not exceed the temperature of 224° C.

9. A method according to claim 7, wherein
   (a) a pure-composition solder column comprises 90% lead and 10% tin,
   (b) the peak temperature is 224° C.,
   (c) the first temperature is 183° C., and
   (d) the first duration is 3.5 minutes.

10. A method according to claim 6, further including one of the two following steps:
    (a) discarding a substrate and its attached solder columns when a solder column is determined to be an off-composition solder column, and
    (b) attaching a substrate with the attached solder columns to a circuit board when all the solder columns are determined to be pure-composition.

11. A method of testing for and detecting off-composition solder columns comprising the steps of:
    assembling a substrate and a plurality of solder columns together;
    heating the assembly according to the following steps:
    (a) inserting the solder columns into a furnace,
    (b) increasing the furnace temperature to a first temperature above which the furnace is maintained for a first duration,
    (c) further increasing the furnace temperature to a peak temperature less than the melting point of a pure-composition solder column,
    (d) decreasing the temperature of the furnace to an exit temperature which is less than the first temperature, and
    (e) removing the solder columns from the furnace;
    visually inspecting the solder columns for changes in physical characteristics representative of off-composition solder columns.

12. A method according to claim 11, wherein the changes in off-composition solder columns include at least one of:
    (a) solder columns having a frosty appearance, and
    (b) solder columns having a diameter smaller than the diameter of other solder columns of the assembly.

13. A method according to claim 12, wherein
    (a) the plurality of solder columns are sheared; and
    (b) the changes in physical characteristics of off-composition solder columns further includes solder columns lacking visible shear marks.

14. A method according to claim 11, further including one of the two following steps:
    (a) discarding a substrate and its attached solder columns when a solder column is determined to be off-composition solder column, and
    (b) attaching a substrate with the attached solder columns to a circuit board when all the solder columns are determined to be pure-composition.

15. A method of testing for and detecting off-composition solder columns where a pure-composition solder column comprises 90% lead and 10% tin, the method comprising the steps of:
    assembling the solder columns and a substrate together by:
    (a) loading solder segments into a graphite mold,
    (b) applying flux on a surface of the substrate,
    (c) placing the substrate and the solder segments together,
    (d) processing the substrate and the mold loaded with solder segments through a furnace to form cast solder columns joined to conductive I/O pads of the substrate;
    heating the assembly of solder columns and substrate by:
    (a) inserting the assembly into a furnace,
    (b) increasing the furnace temperature to 183° C.,
    (c) further increasing the furnace temperature to a peak temperature of 224° C.,
    (d) decreasing the temperature of the furnace to an exit temperature of 75° C. at a rate such that the furnace temperature is maintained above 183° C. for 3.5 minutes, and
    (e) removing the assembly from the furnace; and
    inspecting the solder columns by at least one of:
    (a) visually inspecting the solder columns for a frosty appearance,
    (b) visually inspecting the solder columns for a diameter smaller than the diameter of other solder columns, and
    (c) visually inspecting the solder columns for the absence of shear marks.

16. A method according to claim 15, further comprising one of the two following steps:
    (a) discarding a substrate and its attached solder columns when a solder column is determined to be off-composition solder column; and
    (b) attaching a substrate with the attached solder columns to a circuit board when all the solder columns are determined to be pure-composition.

17. A method according to claim 1, wherein said solder columns are of a ceramic column grid array.

18. A method according to claim 11, wherein said solder columns are of a ceramic column grid array.

19. A method according to claim 15, wherein said solder columns are of a ceramic column grid array.

20. A method of testing for and detecting off-composition solder columns comprising the steps of:
    attaching a plurality of solder columns to a substrate to form an assembly;
    before attachment of the assembly of the substrate and the solder columns to a circuit board, heating the assembly of the substrate and the solder columns according to a temperature profile which will produce visually detectable changes in off-composition solder columns;

performing a visual inspection of the solder columns to detect changes representative of off-composition solder columns; and identifying whether solder columns are off-composition solder columns based on changes detected by the visual inspection.

* * * * *